United States Patent
Chen et al.

(10) Patent No.: US 6,507,110 B1
(45) Date of Patent: Jan. 14, 2003

(54) MICROWAVE DEVICE AND METHOD FOR MAKING SAME

(75) Inventors: Tong Chen, Mountain View, CA (US); Suchet P. Chai, San Jose, CA (US)

(73) Assignee: Teledyne Technologies Incorporated, Los Angeles, CA (US)

( * ) Notice: Subject to any disclaimer, the term of this patent is extended or adjusted under 35 U.S.C. 154(b) by 0 days.

(21) Appl. No.: 09/521,374

(22) Filed: Mar. 8, 2000

(51) Int. Cl.[7] .......................... H01L 23/34; H01L 29/80
(52) U.S. Cl. ....................... 257/728; 257/275; 257/259
(58) Field of Search ............................... 257/728, 778, 257/259, 275; 333/247

(56) References Cited

U.S. PATENT DOCUMENTS

| | | | |
|---|---|---|---|
| 5,065,123 A | * 11/1991 | Heckaman et al. | ......... 333/246 |
| 5,528,203 A | 6/1996 | Mohwinkel et al. | |
| 5,561,085 A | * 10/1996 | Gorowitz et al. | ............ 437/209 |
| 5,612,257 A | 3/1997 | Tserng et al. | |
| 5,614,442 A | 3/1997 | Tserng | |
| 5,635,762 A | 6/1997 | Gamand | |
| 5,668,512 A | 9/1997 | Mohwinkel et al. | |
| 5,708,283 A | 1/1998 | Wen et al. | |
| 5,760,650 A | 6/1998 | Faulkner et al. | |
| 5,847,453 A | 12/1998 | Uematsu et al. | |
| 5,877,560 A | 3/1999 | Wen et al. | |
| 5,932,926 A | 8/1999 | Maruyama et al. | |
| 5,945,734 A | 8/1999 | McKay | |
| 5,949,140 A | 9/1999 | Nishi et al. | |
| 5,990,757 A | 11/1999 | Tonomura et al. | |
| 5,998,817 A | 12/1999 | Wen et al. | |
| 6,124,636 A | * 9/2000 | Kusamitsu | ................... 257/728 |
| 6,225,696 B1 | * 5/2001 | Hathaway et al. | .......... 257/728 |

FOREIGN PATENT DOCUMENTS

JP 61-51946 * 3/1986 ........... H01L/23/12

OTHER PUBLICATIONS

Sakai et al., "A Novel Millimeter–Wave IC on Si Substrate Using Flip–Chip Bonding Technology," *IEICE Trans. Electron*, vol. E78–C, No. 8, Aug. 1995, pp. 971–978.

Ohiso et al., "Flip–Chip Bonded 0.85–μm Bottom–Emitting Vertical–Cavity Laser Array on an AlGaAs Substrate," *IEEE Photonics Technology Letters*, vol. 8, No. 9, Sep. 1996, pp. 1115–1117.

Krems et al., "Avoiding Cross Talk and Feed Back Effects In Packaging Coplaner Millimeter–Wave Circuits," *1998 IEEE MTT–S Digest*, pp. 1091–1094.

Wadsworth et al., "Flip Chip GaAs MMICs for Microwave MCM–D Applications," *Advancing Microelectronics*, May/Jun. 1998, pp. 22–25.

Burggraaf, "Chip scale and flip chip: Attractive Solutions," *Solid State Technology*, Jul. 1998, pp. 239–246.

Peter, "Solder Flip–Chip and CSP Assembly System," *Chip Scale Review*, Jul./Aug. 1999, pp. 58–62.

* cited by examiner

*Primary Examiner*—Tom Thomas
*Assistant Examiner*—Ori Naoav
(74) *Attorney, Agent, or Firm*—Kirkpatrick & Lockhart LLP

(57) ABSTRACT

A microwave device, including a substrate having a first surface and a second surface, a plurality of electrically conductive vias extending through the substrate from the first surface to the second surface, a first interconnect trace connected to the first surface of the substrate and electrically connected to a first of the plurality of vias, a second interconnect trace connected to the first surface of the substrate and electrically connected to a second of the plurality of vias, and a microwave circuit chip connected to the second surface of the substrate and electrically connected to the first and second conductive vias.

24 Claims, 5 Drawing Sheets

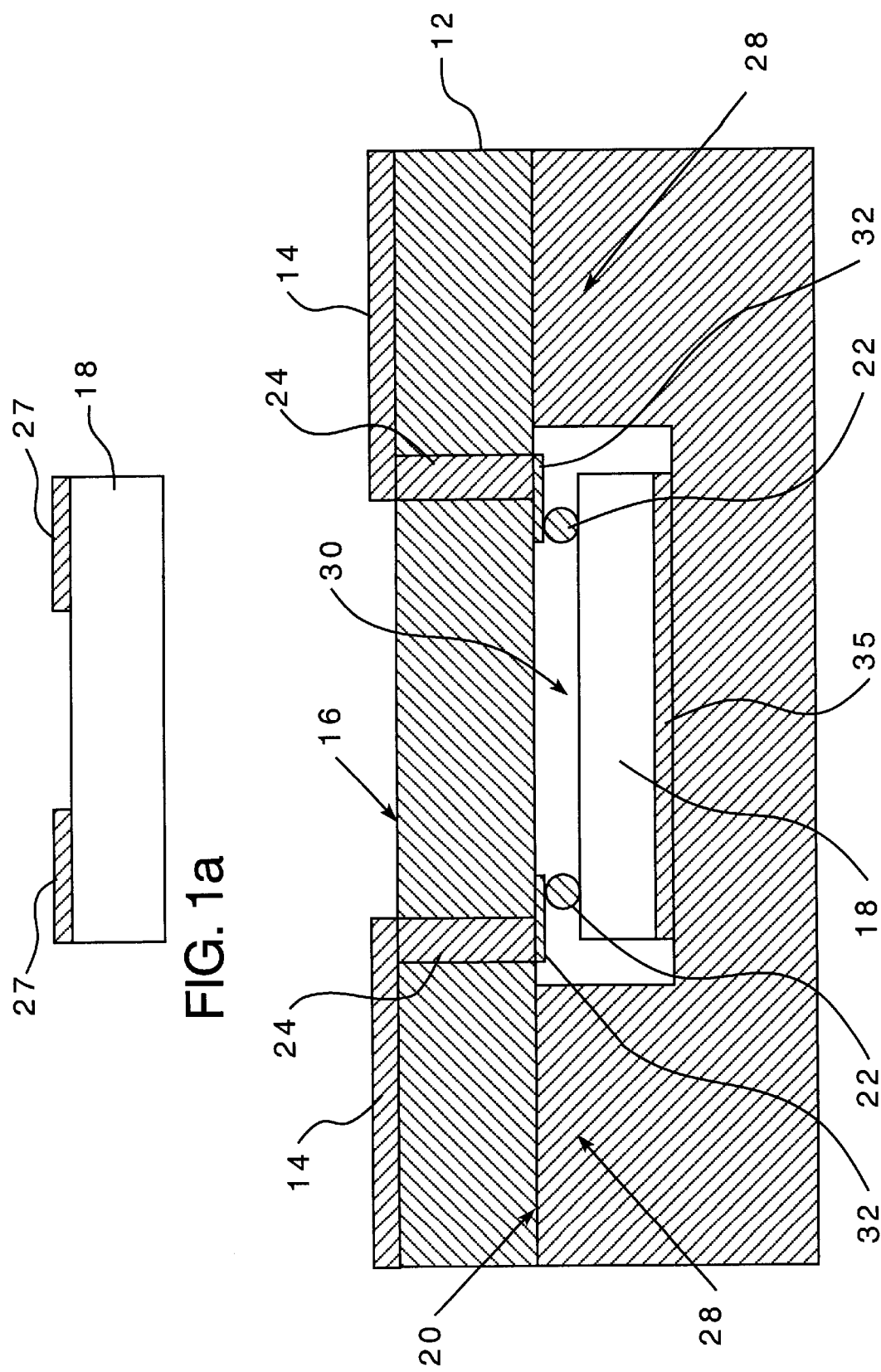

MICROWAVE DEVICE AND METHOD FOR MAKING SAME

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF INVENTION

1. Field of Invention

The present invention relates generally to microwave devices and, more particularly, to microwave devices having transmission lines connected to a first surface of a substrate and a microwave circuit chip connected to a second surface of the substrate.

2. Description of the Background

In the microwave industry, active microwave circuits, such as monolithic microwave integrated circuits (MMICs), are typically electrically connected to a substrate having peripheral circuitry according to traditional interconnect approaches using wire bonding. The performance of such traditional interconnect approaches, however, is often unacceptable for higher frequency applications, such as above 2 GHz. For example, current wire bonding technology prevents wire bonds from being formed which are less than about ten mils. This drawback, coupled with the fact that wire bonds cannot be formed with acceptably tight tolerances at such dimensions, often results in unpredictable and/or unacceptable transmission characteristics for the resulting microwave devices. In addition, traditional interconnect approaches are highly labor intensive, thus minimizing high volume productivity and associated economies of scale benefits.

In view of these drawbacks, some microwave device manufacturers have mounted microwave circuits using flip chip technology. Flip chip mounting has found wide application in the semiconductor packaging and assembly industry for digital and low frequency analog chips because it typically provides a cost and size reduction for the resulting semiconductor package. In contrast to the conventional wire bonding interconnect approach, the flip chip mounting technique involves flipping the chip and connecting the chip's top surface to the substrate. A number electrically conductive flip chip bumps, depending upon the complexity of the chip, are typically provided between the chip's top surface and the substrate to provide an electrical connection between the chip and the substrate, and hence the other components connected to the top surface of the substrate.

In the microwave industry, however, because of difficulties in matching the orientation of the transmission mode fields for the circuits and the substrate, efforts to incorporate flip chip mounting have been primarily limited to devices employing co-planar waveguide (CPW) structures as the transmission media. That is, the circuit and substrate are both designed to support CPW. Many, if not most, commercially available MMICs, however, are designed for microstrip transmission modes, and are therefore ill-suited for CPW transmission structures. Accordingly, using the flip chip technology for microwave devices has ordinarily necessitated redesign or modification of existing microwave circuits to make them compatible for CPW. In addition, the CPW structure has the additional drawback that it still typically requires the use of wire bonding to balance the ground strips of the CPW transmission line structure.

Incorporating flip chip mounting for microwave devices additionally provides disadvantages with respect to thermal handling, especially for power devices. Numerous thermal flip chip bumps must ordinarily be provided between the chip and the substrate to provide a manner for dissipating heat from the chip. The use of the additional thermal flip chip bumps, however, also ordinarily requires a redesign or modification of existing microwave circuits to accommodate the additional bumps. Furthermore, the use of the additional thermal bumps has associated cost, performance, and production drawbacks.

In addition, when using either a traditional interconnect approach or flip chip mounting, external packaging is commonly required to provide electromagnetic and environmental protection for the microwave circuit. Consequently, additional processing steps are required, thereby incurring associated processing costs.

Accordingly, there exists a need for a microwave device in which the microwave circuit is interconnected to the substrate in such a manner as to be acceptable for microwave frequency applications and which does not require the redesign of microwave circuits to accommodate unpopular microwave transmission structures. There further exists a need for a microwave device which provides reliable and efficient thermal handling. There further exists a need for microwave device which does not require additional packaging to provide electromagnetic and environmental protection for the microwave circuit.

BRIEF SUMMARY OF INVENTION

The present invention is directed to a microwave device. According to one embodiment, the microwave device includes a substrate having a first surface and a second surface, a plurality of electrically conductive vias extending through the substrate from the first surface to the second surface, a first interconnect trace connected to the first surface of the substrate and electrically connected to a first of the plurality of vias, a second interconnect trace connected to the first surface of the substrate and electrically connected to a second of the plurality of vias, and a microwave circuit chip connected to the second surface of the substrate and electrically connected to the first and second conductive vias. The microwave device may further include a ground plate connected to the second surface of the substrate, wherein the ground plate includes a recessed portion in which the microwave circuit chip is disposed.

The microwave device of the present invention provides an advantage over prior art microwave devices in that it provides a manner for interconnecting most existing microwave circuits, including microstrip-based MMICs, and a substrate without wire bonding or modification of the circuit. The microwave device of the present invention further provides for efficient and reliable thermal handling. The present invention provides the further advantage that the microwave devices are more reproducible and consistent, thus reducing tuning requirements and providing enhanced yield and improved performance. Another advantage of the present invention is that the assembly technique itself provides packaging of the microwave chip, thus obviating the need for additional packaging. Moreover, when used, for example, in constructing a subsystem module, the present invention obviates the need to obtain pre-packaged chips because the chips are packaged as part of the assembly

DESCRIPTION OF THE FIGURES

For the present invention to be clearly understood and readily practiced, the present invention will be described in conjunction with the following figures, wherein:

FIG. 1a is a view of a microwave circuit chip of the microwave device according to one embodiment;

FIG. 1b is a cross-sectional side-view of the microwave device according to another embodiment;

DETAILED DESCRIPTION OF THE INVENTION

Figure 1:
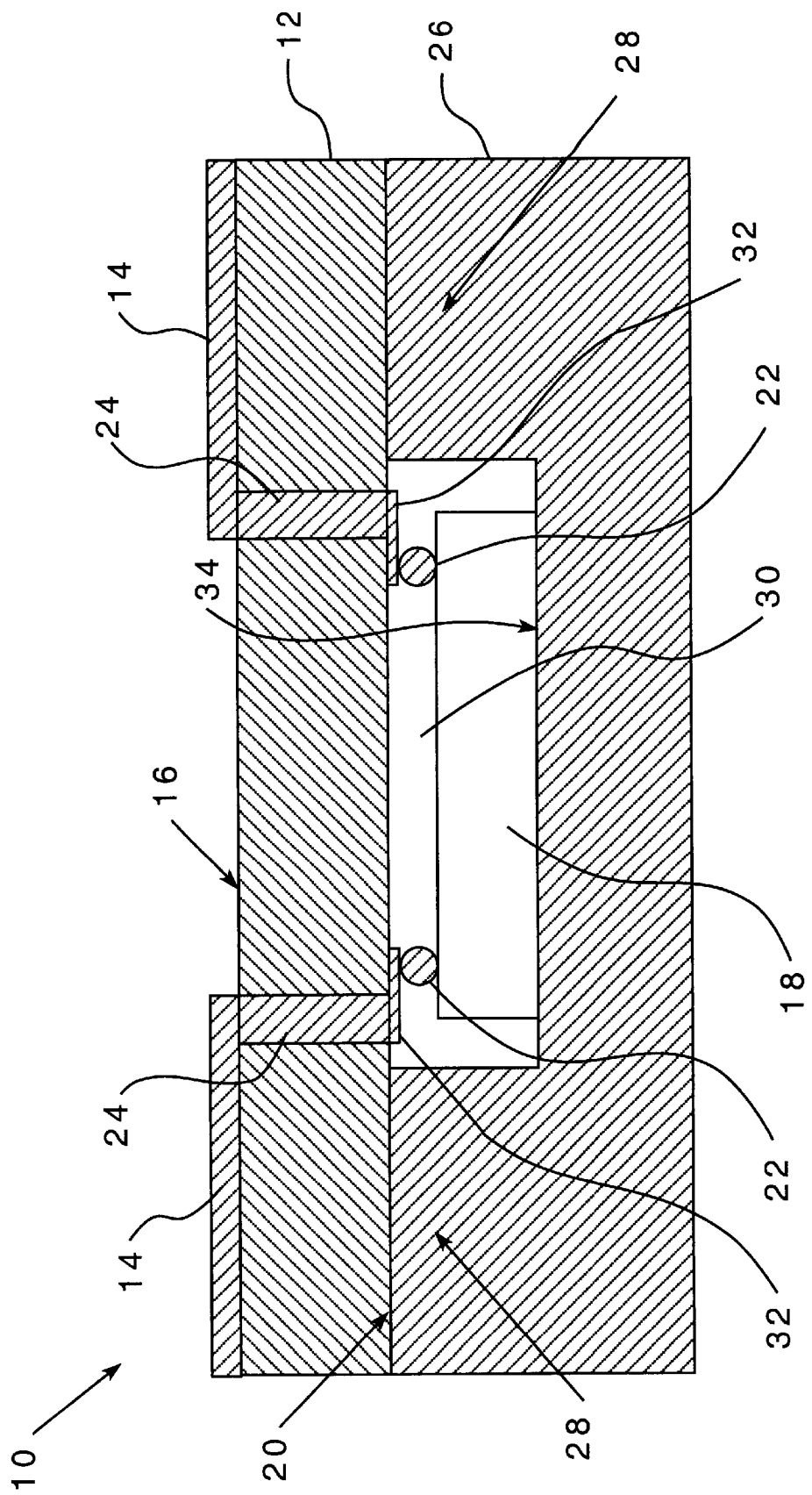
FIG. 1 is a cross-sectional side-view of a microwave device according to one embodiment of the present invention.

FIG. 1 is a cross-sectional side view of a microwave device 10 according to one embodiment of the present invention. The device 10 includes a substrate 12 having interconnect traces 14 connected to an upper surface 16 of the substrate 12, and a microwave circuit chip 18 electrically connected to the interconnect traces 14 from a lower surface 20 of the substrate 12. The microwave circuit chip 18 is electrically connected to the interconnect traces 14 via a number of electrically conductive bumps 22 and a number of electrically conductive vias 24 extending through the substrate 12. The device 10 may also include an electrically conductive ground plate 26 having an upper portion 28 connected to the lower surface 20 of the substrate 12. The ground plate 26 includes a recessed portion 30 in which the microwave circuit chip 18 is disposed.

The substrate 12 may be an insulative material such as, for example, ceramic, glass, woven fiberglass laminates, and Teflon®-based laminates, including Duroid® microwave laminates, or any other insulative material used for microwave printed circuit boards. The lower surface 20 of the substrate 12 may have formed thereon an electrically conductive ground plane, as described further hereinbelow with respect to FIG. 3. The substrate 12 may further define a number of holes extending from the upper surface 16 of the substrate 12 to the lower surface 20. The holes in the substrate 12 may be filled with electrically conductive material, such as metal or conductive polymers, to form the conductive vias 24. The conductive vias 24 may be formed, for example, by thick film techniques (such as screen-printing of conductive paste) or doctor blading.

The ground plate 26 includes an upper portion 28 which may be connected to the bottom surface 20 of the substrate 12. The upper portion 28 of the ground plate 26 also includes a recessed portion 30 in which the microwave circuit chip 18 is disposed. The ground plate 26 is electrically conductive and may be, for example, metal, such as aluminum or copper, or an insulator having a conductive coating. The ground plate 26 may be formed from a single piece of material, or it may be formed from the bonding of several pieces, even of different material. The ground plate 26 may be mounted to the substrate 12, for example, by epoxy bonding, as discussed hereinbelow. The device 10 of the present invention will be described herein as including the ground plate 26, although certain benefits of the present invention may be realized without the ground plate 26. For example, for an embodiment of the present invention not including the ground plate 26, the ground plane formed on the lower surface 20 of the substrate 12, as described further hereinbelow with respect to FIG. 3, may act as the lower conductor for a microstrip-based device.

The interconnect traces 14 include electrically conductive material such as, for example, aluminum or copper, and may be formed on the upper surface 16 of the substrate 12 by, for example, conventional thick or thin film photolithographic deposition and etching techniques. The interconnect traces 14 are in contact with the vias 24, and hence are electrically connected to the microwave circuit chip 18 though the vias 24 and the bumps 22, as described hereinbelow. The interconnect traces 14 may include transmission lines for various microwave transmission modes including, for example, microstrip, co-planar waveguide (CPW), grounded CPW, and stripline transmission modes. For example, for an embodiment using a microstrip transmission mode, the interconnect traces 14 may be microstrip transmission lines which, in conjunction with the ground plate 26 and/or the ground plane formed on the lower surface 20 of the substrate 12, form a microstrip transmission medium, with the substrate 12 as the dielectric therebetween. The lowest order transmission mode for such a medium may be a quasi-TEM transmission mode, however, at higher frequencies, higher-order transmission modes may be supported. For an embodiment using a CPW transmission mode, the interconnect traces 14 may include a center conducting interconnect trace and two flanking conducting interconnect traces. For an embodiment of the present invention using a stripline transmission mode, the substrate 12 may be multi-layered, including additional insulative (dielectric) layers and ground planes to support a stripline transmission mode.

The electrically conductive bumps 22 provide an electrical connection between the vias 24 (and hence the interconnect traces 14) and bonding pads, or electrodes, of the microwave circuit chip 18. The bonding pads 27 of the microwave circuit chip are shown in FIG. 1a. The bumps 22 may be formed, for example, of metal, such as gold, or conductive polymers, and may have a diameter of approximately four mills or less. To facilitate the connection between the vias 24 and the bumps 22, electrically conductive contact pads 32 may be provided on the lower surface 20 of the substrate 12. The contact pads 32 may be formed, for example, from metal or conductive polymers, and may be formed, for example, by conventional photolithographic film deposition and etching techniques or conventional PCB fabrication techniques.

The microwave circuit chip 18 may be a die having fabricated thereon a microwave circuit. The die may be fabricated from, for example, gallium arsenide (GaAs), although other semiconductor materials, such as silicon, gallium nitride (GaN), and silicon carbide, may also be used. The circuit may be any type of microwave circuit including, for example, a transistor, such as a field effect transistor (FET) or a heterojunction bipolar transistor (HBT), or a number of transistors. For example, the microwave circuit may be a power amplifier having different amplification stages. According to another embodiment, the microwave circuit may be a low noise amplifier. In addition, the microwave circuit may be a monolithic microwave integrated circuit (MMIC) including, for example, a power amplifier MMIC, a low noise amplifier MMIC, an up-down converter MMIC, a mixer MMIC, a transceiver MMIC, and an oscillator MMIC. Further, the MMICs used in the present invention may, for example, support a microstrip transmission mode.

The microwave circuit chip 18 may have electrically conductive bonding pads or electrodes for connection to the interconnect traces 14 through the vias 24 and the bumps 22, and may have a conductive portion at a lower surface 34 of the microwave circuit chip 18. The conductive portion at the lower surface 34 may act as a signal ground for the chip 18, as well as provide for heat dissipation. A thin, electrically conductive shim 35 (shown in FIG. 1b) may be attached to the conductive portion at the lower surface 34 of the chip 18, as described hereinbelow. The chip 18 may be mounted to the substrate 12 using, for example, flip chip mounting techniques, such as thermal compression or epoxy bonding. It should be noted, however, that according to the present invention, unlike conventional flip chip bonding, the microwave circuit chip 18 is not "flipped." Rather, the "top" or active surface of the microwave circuit chip 18 is connected to the substrate 12, and the "bottom" or ground surface of the microwave circuit chip 18 is not, thereby maintaining the orientation of the transmission fields for the chip 18 and the substrate 12, and obviating the need for wire bonding. Additionally, the device 10 of the present invention may use most existing microwave circuit chips without having to modify the chip to support different transmission modes.

In addition, with the microwave device 10 of the present invention, the ground plate 26 may provide a signal ground for the microwave circuit chip 18, as well as a thermal conductor to facilitate the dissipation of heat from the microwave circuit chip 18, if needed. In addition, with the microwave circuit chip 18 disposed in the recessed portion 30 of the ground plate 26, the ground plate 26 provides electromagnetic and environmental protection for the microwave circuit chip 18. Consequently, the ground plate 26 may prevent electromagnetic radiation from the chip 18 from interfering with other devices, as well as prevent radiation from other devices from interfering with the operation of the chip 18. In addition, the ground plate 26 may prevent environmental conditions, such as moisture, from interfering with the operation of the chip 18.

Figure 2:
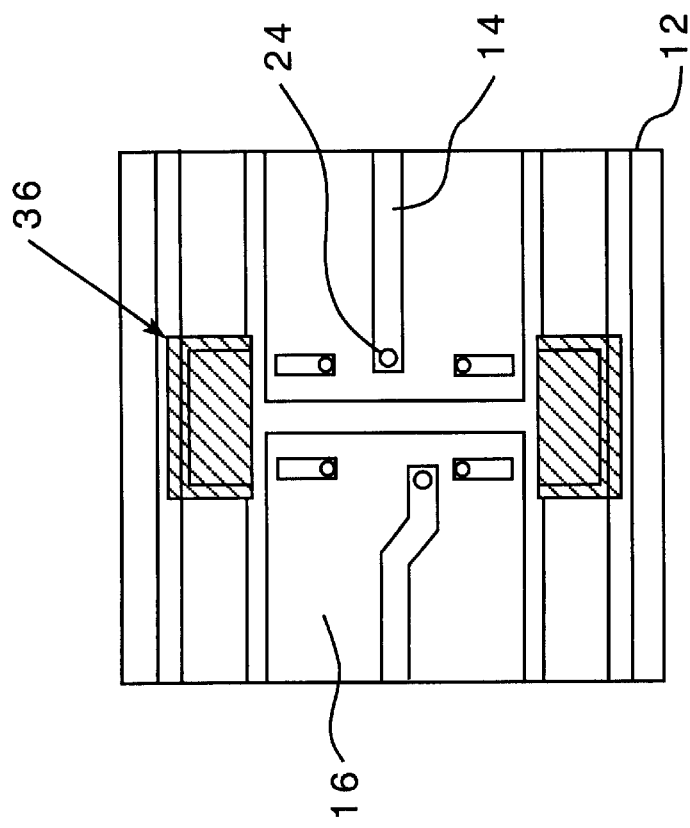
FIG. 2 is a plan view of the upper surface of the substrate of the microwave device of FIG. 1 according to one embodiment of the present invention.

FIG. 2 is a plan view of the upper surface 16 of the substrate 12 according to one embodiment of the present invention. The upper surface 16 of the substrate 12 includes the interconnect traces 14 and some distributed and lumped circuit elements 36. The circuit elements 36 may be, for example, thick film resistors and capacitors. The interconnect traces 14 and the circuit elements 36 may be formed, for example, by thick or thin film technology. Some of the interconnect traces 14, in conjunction with the circuit elements 36, may provide impedance matching or bias circuitry for the microwave circuit chip 18. In addition, discrete components, such as resistors, capacitors, and integrated circuits, may be surface-mounted to the upper surface 16 of the substrate 12.

Figure 3:
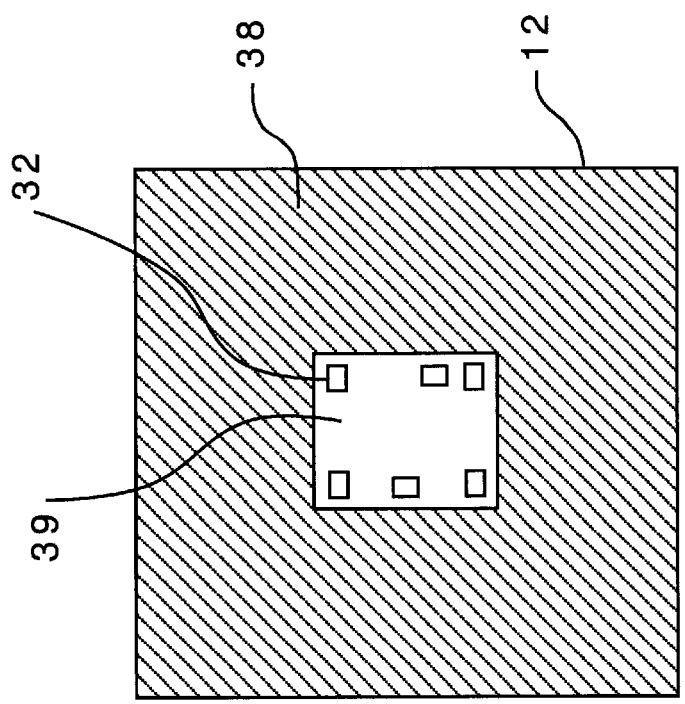
FIG. 3 is a plan view of the lower surface of the substrate of the microwave device of FIG. 1 according to one embodiment of the present invention.

FIG. 3 is a plan view of the lower surface 20 of the substrate 12 according to one embodiment of the present invention. As shown in FIG. 3, the substrate 12 includes a ground plate 38 of electrically conductive material covering the entire lower surface 20 of the substrate 12 except for a window 39. The location of the window 39 corresponds to the location of the recessed portion 30 of the ground plate 26 when the ground plate 26 is attached to the lower surface 20 of the substrate 12. Located within the window 39 are the contact pads 32, which correspond in position to the location of the bonding pads of the microwave circuit chip 18. According to another embodiment of the present invention, the lower surface 20 of the substrate 12 does not include the ground plane 38. For such an embodiment, the ground plate 26 is connected directly to the lower surface 20 of the substrate 12.

Figure 4:
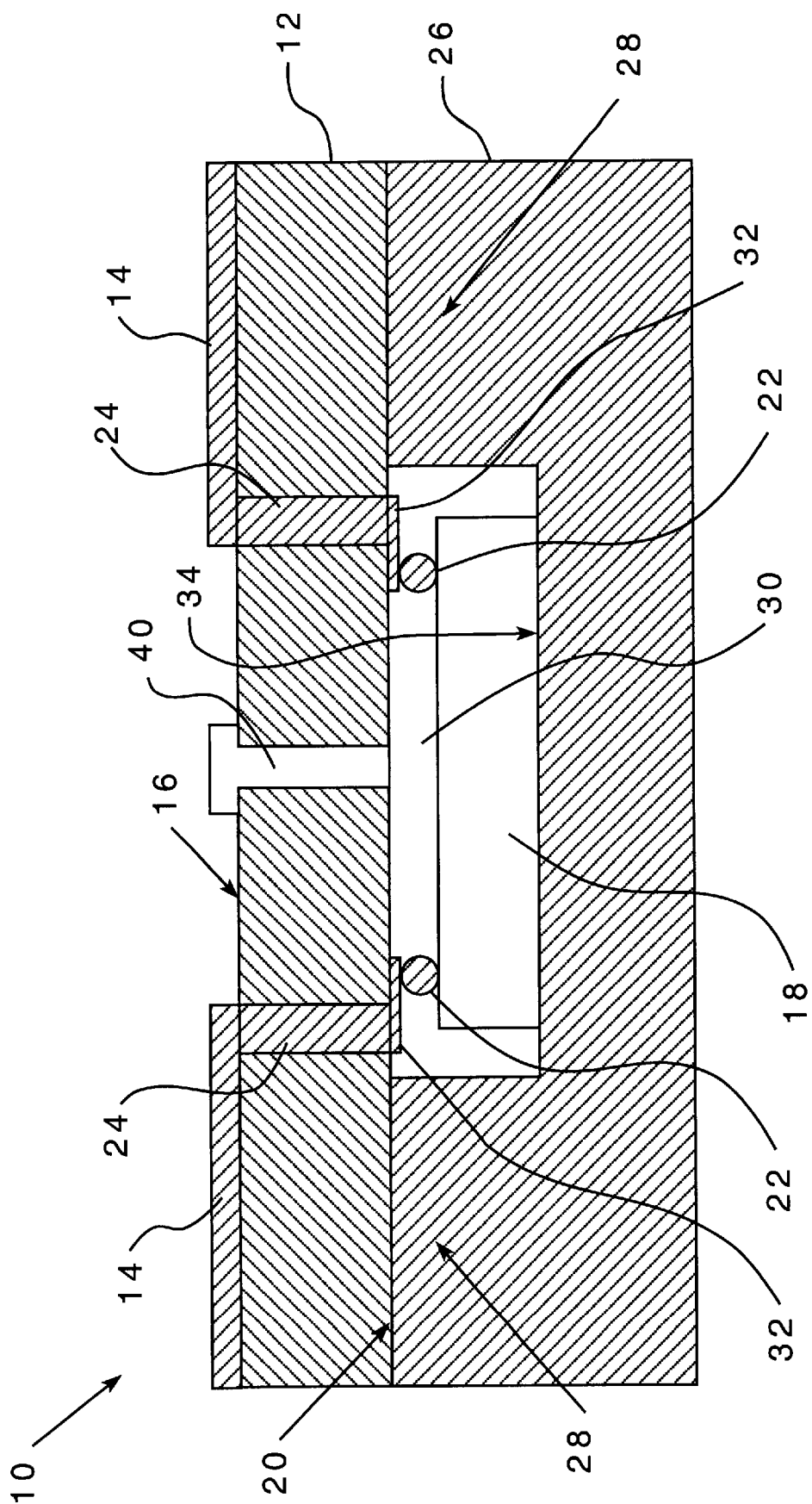
FIG. 4 is a cross-sectional side view of the microwave device according to another embodiment of the present invention.

FIG. 4 is a cross-sectional side-view of the microwave device 10 according to another embodiment of the present invention. The device 10 of FIG. 4 is similar to that of FIG. 1, except that it includes an isolation device 40 extending from the upper surface 16 of the substrate 12 to the lower surface 20 and between the interconnect traces 14. The isolation device 40 may be used, for example, to provide electromagnetic isolation between interconnect traces 14 of the device 10. It may be beneficial to provide the isolation device 40 between certain interconnect traces 14, such as when the interconnect traces 14 are sufficiently proximate that coupling therebetween may occur. Coupling between interconnect traces 14 may result, for example, when the microwave circuit chip 18 is relatively small, such as when the chip 18 includes, for example, only a single transistor, or where the chip 18 has a very high gain.

According to one embodiment, the isolation device 40 may include microwave frequency radiation absorbing material such as, for example, Eccosorb® microwave absorber (Eccosorb is a federally registered trademark of Emerson & Cuming, Inc., Randolph, Mass.). According to another embodiment, the isolation device 40 may include an electrically conductive material, such as metal or conductive polymers. For such an embodiment, the isolation device 40 may be coupled to ground, such as the interface between the lower surface 20 of the substrate 12 and the ground plate 26.

Figure 5:
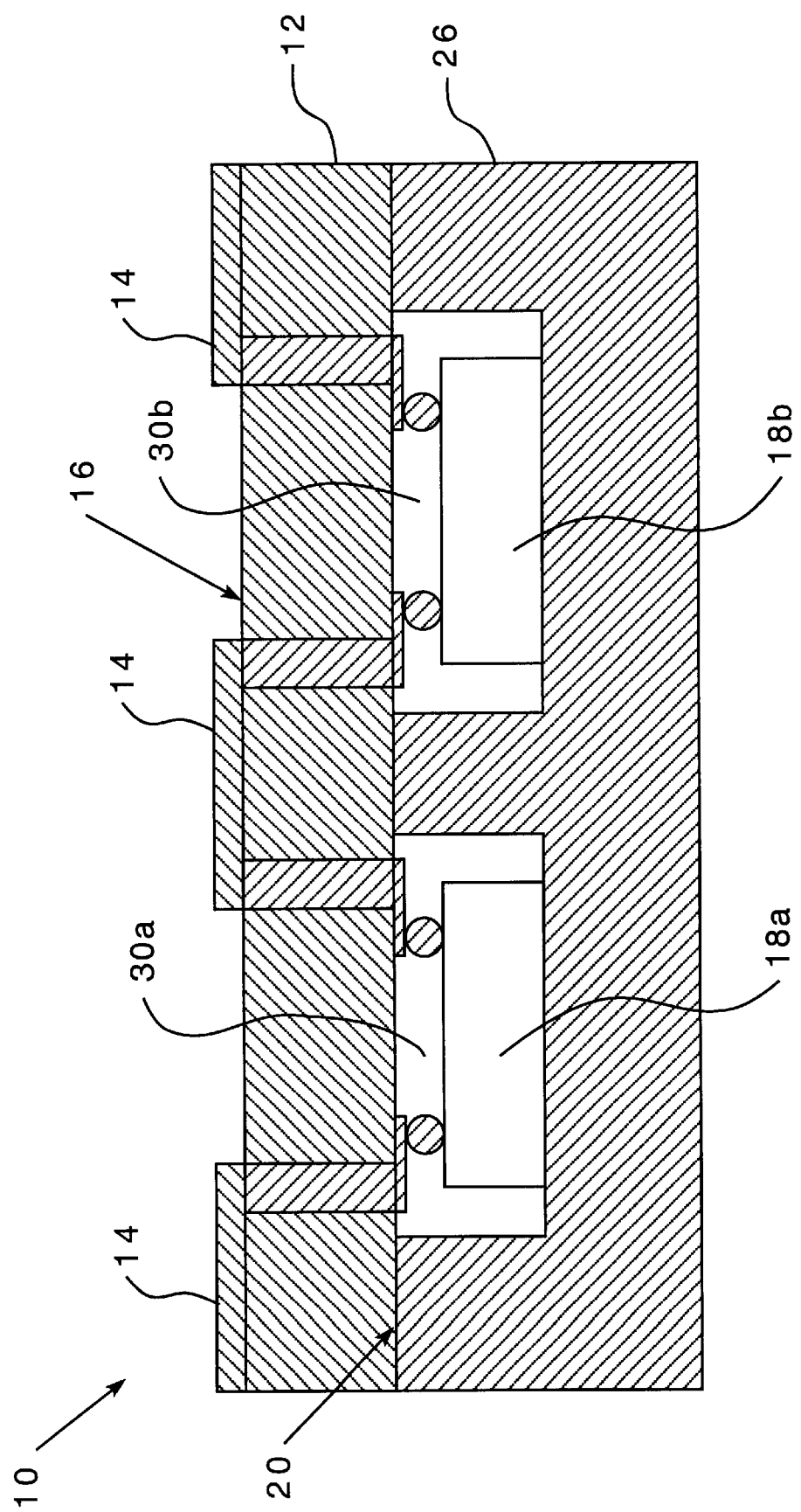
FIG. 5 is a cross-sectional side view of the microwave device according to another embodiment of the present invention.

Benefits of the present invention may be realized not only for microwave devices 10 including a single microwave circuit chip 18, as discussed hereinbefore with respect to FIGS. 1–4, but may also be realized in microwave devices 10 including a plurality of microwave circuit chips 18, such as may be used for multi-chip modules (MCM) or subsystem modules. FIG. 5 is a cross-sectional side-view of the microwave device 10 according to such an embodiment. The device 10 illustrated in FIG. 5 includes two microwave circuit chips 18a, 18b, although the benefits of the present invention may be realized with any number of microwave circuit chips 18. In the illustrated embodiment, the microwave circuit chips 18a, 18b are disposed in separate recessed portions 30a, 30b of a common ground plate 26. According to other embodiments, multiple ground plates 26 may be attached to the lower surface 20 of the substrate 12, each including one or more recessed portions 30 for containing at least one microwave circuit chip 18. Other embodiments of the device 10 illustrated in FIG. 5 may include the isolation device 40, as described hereinbefore with respect to FIG. 4, to isolate certain interconnect traces 14. Thus, the present invention obviates the need to obtain pre-packaged chips in constructing a subsystem module, as is currently customary in the industry, since the chips 18 are packaged as part of the assembly process, thereby reducing the cost and size of the module.

In addition, according to such an embodiment, the first chip 18a may include a first type of semiconductor material, such as GaAs, and the second chip 18b may include, for example, a second, less expensive, type of semiconductor material, such as silicon. According to such an embodiment, those components requiring the first semiconductor material for performance purposes, such as active and/or high frequency components, may be concentrated on the first chip 18*a*, and other components not requiring the first type of semiconductor material may be concentrated on the second chip 18*b*.

To fabricate the device 10 according to one embodiment of the present invention, the vias 24 may be formed in holes of the substrate 12 as discussed hereinbefore, and the substrate 12 may be processed using, for example, thick or thin film technology, to produce the interconnect traces 14 and the circuit elements 36 on the upper surface 16 of the substrate. The bottom surface 20 of the substrate 12 may then be coated with the conductive ground plate 38, except for the window 39 where the microwave circuit chip 18 is to be attached. The ground plate 38 may be formed, for example, by using vacuum metallization or sputtering. Before, after, or simultaneously with the coating of the lower surface 20 of the substrate 12, the contact pads 32 may be formed on the lower surface 20 of the substrate 12 within the window 39.

To attach the chip 18 to the substrate 12, a thin, electrically conductive shim may be eutecticly attached to the lower surface 34 of the chip 18. The shim may have a surface area slightly larger than the chip 18, and may be made, for example, of a material having a coefficient of thermal expansion (CTE) matching the material comprising the chip 18. The shim may include, for example, elemental metal or composite metal such as molybdenum, CuW, Cu/Mo/Cu, or aluminum silicon carbide. The shim facilitates chip-handling during the fabrication process and provides a buffer for thermal expansion mismatch. The bumps 22 may then be attached to the bonding pads of the chip 18 by ball bonders. The chip 18 may then be attached to the lower surface 20 of the substrate 12 by, for example, thermal compression using a flip-chip die attach machine. The ground plate 26 may then be attached to the lower surface 20 of the substrate 12 and the shim on the lower surface 34 of the chip 18 with, for example, conductive epoxy. Consequently, the manufacture of the device 10 of the present invention may be fully automated. Thereafter, discrete components, such as resistors, capacitors, and integrated circuits, may be connected to the upper surface 16 of the substrate 12 as desired. A lid (not shown) of, for example, ceramic or plastic, may be placed over the device 10, although it is not necessary. In addition, lead frames (not shown) may be bonded to the upper surface 16 of the substrate 12 during the processing to provide for external connectivity of the device 10 if desired.

Accordingly, the microwave device 10 of the present invention provides a manner for interconnecting existing types of microwave circuits chips 18, including microstrip-based MMICs, and a substrate 12 without the use of wire bonding or modification of the circuit. In addition, by using flip chip mounting techniques to interconnect the microwave circuit chip 18 and the substrate 12, the manufacturing process may be automated and the yield increased. Moreover, by eliminating wire bonding, the device 10 is more reproducible and consistent, thus reducing tuning requirements and providing enhanced yield and improved performance. Additionally, by connecting the ground plate 26 to the lower surface 34 of the chip 18, efficient and reliable thermal handling of the chip 18 is provided. Furthermore, the assembly technique of the present invention itself provides packaging for the microwave circuit chip 18, thus obviating the need for additional packaging.

In addition, another benefit of the present invention is that for an embodiment in which the microwave circuit chip 18 includes an expensive semiconductor material such as GaAs, the chip 18 may only include the active elements of the circuit formed on the chip 18, and the passive elements, such as the impedance matching and bias circuitry, may be formed on the substrate 12. Accordingly, the chip 18 does not need to include the passive elements of the circuit, which normally occupy a large chip area, thereby minimizing the amount of expensive semiconductor material needed by the chip 18.

Although the present invention has been described herein with respect to certain embodiments, those of ordinary skill in the art will recognize that many modifications and variations of the present invention may be implemented. The foregoing description and the following claims are intended to cover all such modifications and variations. Furthermore, the materials and processes disclosed are illustrative, but are not exhaustive. Other materials and processes may also be used to make devices embodying the present invention. In addition, the described sequences of the processing may also be varied.

What is claimed is:

1. A microwave device, comprising:
   a substrate having first and second opposing surfaces;
   a plurality of electrically conductive vias extending through the substrate from the first surface to the second surface;
   at least one circuit component mounted directly on the first surface of the substrate;
   a first interconnect trace connected to the first surface of the substrate and electrically connected to the circuit component and a first of the plurality of vias;
   a second interconnect trace connected to the first surface of the substrate and electrically connected to a second of the plurality of vias;
   a microwave circuit chip having an upper active surface and lower ground surface, wherein the upper active surface faces the second surface of the substrate and is electrically connected to the first and second conductive vias; and
   an electrical conductor directly connected to the second surface of the substrate and defining a recess in which the microwave circuit chip is disposed, wherein the first and second interconnect traces, the substrate and the electrical conductor form a microstrip transmission medium having the same transmission field orientation as that of the microwave circuit chip.

2. The microwave device of claim 1, wherein the electrical conductor includes a ground plate having a recessed portion defining a recess, and wherein the microwave circuit chip is disposed in the recess.

3. The microwave device of claim 2, wherein the at least one circuit component is surface mounted to the first surface of the substrate.

4. The microwave device of claim 2, wherein the at least one circuit component includes a discrete circuit component selected from the group consisting of a resistor, a capacitor, and an integrated circuit.

5. The microwave device of claim 2, wherein the at least one circuit component includes a thick film circuit element.

6. The microwave device of claim 5, wherein the thick film circuit element is selected from the group consisting of a resistor and a capacitor.

7. The microwave device of claim 2, wherein the at least one circuit component includes a thin film circuit element.

8. The microwave device of claim 7, wherein the thin film circuit element is selected from the group consisting of a resistor and a capacitor.

9. The microwave device of claim 2, wherein the microwave circuit chip includes a transistor.

10. The microwave device of claim 2, wherein the microwave circuit chip includes a MMIC.

11. The microwave device of claim 10, wherein the microwave circuit chip includes a microstrip-based MMIC.

12. The microwave device of claim 2, wherein the microwave circuit chip is electrically connected to the first and second vias by a plurality of electrically conductive bumps.

13. The microwave device of claim 12, wherein the microwave circuit chip includes a plurality of bonding pads on the active surface of the microwave circuit chip, wherein the bonding pads are electrically connected to the bumps.

14. The microwave device of claim 2, wherein a portion of the second surface of the substrate is coated with an electrically conductive material.

15. The microwave device of claim 2, further comprising an electrically conductive shim interposed between the second surface of the substrate and the ground plate.

16. A microwave device, comprising:
a substrate having first and second opposing surfaces;
a plurality of electrically conductive vias extending through the substrate from the first surface to the second surface;
at least one circuit component mounted directly on the first surface of the substrate;
a first interconnect trace connected to the first surface of the substrate and electrically connected to the circuit component and a first of the plurality of vias;
a second interconnect trace connected to the first surface of the substrate and electrically connected to a second of the plurality of vias;
a microwave circuit chip having an upper active surface and lower ground surface, wherein the upper active surface faces the second surface of the substrate and is electrically connected to the first and second conductive vias;
a ground plate directly connected to the second surface of the substrate and defining a recess in which the microwave circuit chip is disposed, wherein the first and second interconnect traces, the substrate and the ground plate form a microstrip transmission medium having a transmission field orientation as that of the microwave circuit chip; and
an isolation device connected to the substrate and adjacent the first microwave circuit chip.

17. The microwave device of claim 16, wherein the isolation device includes a microwave frequency absorbing material.

18. The microwave device of claim 17, wherein the isolation device extends from the first surface of the substrate to the second surface of the substrate.

19. The microwave device of claim 16, wherein the at least one circuit component is surface mounted to the first surface of the substrate and includes a discrete circuit component selected from the group consisting of a resistor, a capacitor, and an integrated circuit.

20. The microwave device of claim 16, wherein the at least one circuit component includes a thick film circuit element.

21. The microwave device of claim 16, wherein the at least one circuit component includes a thin film circuit element.

22. A microwave device, comprising:
a substrate having first and second opposing surfaces;
a plurality of electrically conductive vias extending through the substrate from the first surface to the second surface;
at least one circuit component mounted directly on the first surface of the substrate;
a plurality of interconnect traces connected to the first surface of the substrate and electrically connected to the plurality of vias, wherein at least one interconnect trace is also electrically connected to the circuit component;
a ground plate directly connected to the second surface of the substrate, the ground plate defining first and second recesses;
a first microwave circuit chip, having an upper active surface and lower ground surface, disposed in the first recess defined by the ground plate such that the upper active surface of the first microwave circuit chip faces the second surface of the substrate and is electrically connected to a first set of the electrically conductive vias; and
a second microwave circuit chip, having an upper active surface and lower ground surface, disposed in the second recess defined by the ground plate such that the upper active surface of the second microwave circuit chip faces the second surface of the substrate and is electrically connected to a second set of the electrically conductive vias,
wherein the interconnect traces, the substrate and the ground plate form a microstrip transmission medium having the same transmission field orientation as that of the first and second microwave circuit chips.

23. The microwave device of claim 22, further comprising:
a first isolation device connected to the substrate and adjacent the first microwave circuit chip; and
a second isolation device connected to the substrate and adjacent the second microwave circuit chip.

24. The microwave device of claim 23, wherein each of the first and second isolation devices include a microwave frequency absorbing material.

* * * * *

UNITED STATES PATENT AND TRADEMARK OFFICE
CERTIFICATE OF CORRECTION

PATENT NO. : 6,507,110 B1
DATED : January 14, 2003
INVENTOR(S) : Tong Chen and Suchet P. Chai It is certified that error appears in the above-identified patent and that said Letters Patent is hereby corrected as shown below:

<u>Title page, Item [54] and Column 1, lines 1 and 2,</u>
Title, delete "MICROWAVE DEVICE AND METHOD FOR MAKING SAME" and substitute therefore -- A MICROWAVE CHIP IN A RECESSED CONDUCTOR --.

<u>Column 9,</u>
Line 46, delete "having a", and substitute therefore -- having the same --.

Signed and Sealed this

Seventeenth Day of February, 2004

JON W. DUDAS
*Acting Director of the United States Patent and Trademark Office*